United States Patent
Klee et al.

(10) Patent No.: US 9,945,915 B2
(45) Date of Patent: Apr. 17, 2018

(54) HIGH MAGNETIC FIELD COMPATIBLE INTERVENTIONAL NEEDLE AND INTEGRATED NEEDLE TRACKING SYSTEM

(75) Inventors: Mareike Klee, Straelen (DE); Axel Winkel, Zapel-Hof (DE); John Brean Mills, Eindhoven (NL); Ronald Dekker, Eindhoven (NL); Bernardus Hendrikus Wilhelmus Hendriks, Eindhoven (NL)

(73) Assignee: Koninklijke Philips N.V., Eindhoven (NL)

( * ) Notice: Subject to any disclaimer, the term of this patent is extended or adjusted under 35 U.S.C. 154(b) by 781 days.

(21) Appl. No.: 13/265,387

(22) PCT Filed: Apr. 13, 2010

(86) PCT No.: PCT/IB2010/051581
§ 371 (c)(1),
(2), (4) Date: Jan. 17, 2012

(87) PCT Pub. No.: WO2010/122443
PCT Pub. Date: Oct. 28, 2010

(65) Prior Publication Data
US 2012/0116209 A1    May 10, 2012

(30) Foreign Application Priority Data
Apr. 20, 2009 (EP) .................................... 09158232

(51) Int. Cl.
*G01R 33/28* (2006.01)
*G01R 33/34* (2006.01)

(52) U.S. Cl.
CPC ...... *G01R 33/287* (2013.01); *G01R 33/34007* (2013.01); *G01R 33/34084* (2013.01); *Y10T 29/4902* (2015.01)

(58) Field of Classification Search
CPC .................................................... G01R 33/287
(Continued)

(56) References Cited

U.S. PATENT DOCUMENTS 6,031,375 A    2/2000  Atalar et al.
6,103,587 A *  8/2000  Nakabeppu ............. H01L 28/82
                                                         257/306

(Continued)

FOREIGN PATENT DOCUMENTS

JP    02094778       4/1991
JP    2008226969 A   9/2008

OTHER PUBLICATIONS

Dennis Ellersiek et al., "A Monolithically Fabricated Flexible Resonant Circuit for Catheter Tracking in Magnetic Resonance Imaging", Sensors and Actuators B: Chemical, Elsevier BV 144 (2010), pp. 432-436.

(Continued)

*Primary Examiner* — Jonathan Cwern

(57) ABSTRACT

An elongate device, such as a catheter, for interventional MRI has one or more passive LC-circuits attached to its distal tip portion for position tracking. The LC-circuits includes an inductor winding and a three-dimensional "trench" capacitor. The LC-circuits are integrated in a piece of silicon. Optical fibers may be included in the device for optical probing of tissue surrounding the distal tip portion.

13 Claims, 4 Drawing Sheets

(58) Field of Classification Search
USPC .............. 600/423, 424; 438/681; 29/602.1
See application file for complete search history.

(56) References Cited

U.S. PATENT DOCUMENTS

| | | | |
|---|---|---|---|
| 6,236,205 B1* | 5/2001 | Ludeke et al. ............. 324/318 |
| 6,352,944 B1* | 3/2002 | Kraus et al. ............... 438/778 |
| 6,377,048 B1 | 4/2002 | Golan et al. |
| 7,025,765 B2 | 4/2006 | Balbierz et al. |
| 7,742,799 B2 | 6/2010 | Mueller et al. |
| 2002/0026188 A1 | 2/2002 | Balbierz et al. |
| 2003/0189212 A1* | 10/2003 | Yoo ............................... 257/79 |
| 2004/0176732 A1 | 9/2004 | Frazier et al. |
| 2005/0146327 A1* | 7/2005 | Jakab ........................... 324/302 |
| 2006/0017115 A1* | 1/2006 | Tu .................... H01L 27/10861 257/371 |
| 2007/0043288 A1 | 2/2007 | Mueller |
| 2007/0083122 A1 | 4/2007 | Alfano et al. |
| 2008/0132777 A1* | 6/2008 | Durr et al. .................... 600/411 |
| 2009/0261897 A1* | 10/2009 | Bobde .................... H01L 23/60 327/552 |
| 2012/0116209 A1 | 5/2012 | Klee |

OTHER PUBLICATIONS

E.W. Jacobs et al., "Photo-Injection P-I-N Diode Switch for High-Power RF Switching", IEEE Trans. on Microwave Theory and Techniques, vol. 50, No. 2, Feb. 2002, pp. 413-419.
Titus Keuhne et al., "Catheter Visualization with Resonant Markers at MR Imaging-Guided Deployment Endovascular of Stents in Swine", Radiology, vol. 233, No. 3, pp. 774-780.
L. Renaud et al., "Implantable Planar RF Microcoils for NMR Microspectroscopy", Sensors and Actuators A 99 (2002) 244-248.
C.K. Sun et al., "Photo-Injection Back-to-Back PIN Switch for RF Control", Electronics Letters Aug. 28, 1997, vol. 33, No. 18, pp. 1579-1580.
R.R.A. Syms et al., "Microengineered Needle Micr-Coils for Magnetic Resonance Spectroscopy", Journ. Micromech. Microeng. 16 (2006), pp. 2755-2764.
Th. Uelzen et al., "Mechanical and Electrical Properties of Electroplated Copper for MR-Imaging Coils", Microsyst. Technol. (2006) 12, pp. 343-351.
Steffen Weiss et al., "MR-Controlled Fast Optical Switching of a Resonant Circuit Mounted on the Tip of a Clinical Catheter", Proc. Intl. Soc. Mag. Reson. Med. 9 (2001), p. 544.

* cited by examiner

HIGH MAGNETIC FIELD COMPATIBLE INTERVENTIONAL NEEDLE AND INTEGRATED NEEDLE TRACKING SYSTEM

FIELD OF THE INVENTION

The present invention relates to a device for intervention in a high magnetic field and to a method for producing the same. In particular, the invention relates to an interventional needle which is useable in an MRI system, wherein the needle is traceable in an MRI image.

BACKGROUND OF THE INVENTION

For correct diagnosis of various cancer diseases biopsies are taken via a lumen of an endoscope or via needle or via catheter. In order to find the correct position to take the biopsy, various imaging modalities are used such as X-ray, CT, Magnet Resonance Imaging (MRI) and ultrasound. Although helpful, these methods of guidance are far from optimal.

Interventional procedures such as biopsy taking with needles are carried out more and more under MRI guidance. This puts strong demands on the needle material. Needles are requested, which are compatible with high magnetic fields such as 3 T. Here conventional material applied for MR compatible systems such as Ti and Ti alloys are coming to their limits. With increasing magnetic fields up to 3 T, these needles can show during the procedure local heat caused by eddy currents and are therefore not suited.

To realize high magnetic field compatible needles, today new technologies for needles are studied. This comprises needles based on pure organic material e.g. plastic as well as plastic needles with ceramic tips.

The plastic needles are much more flexible than the metal needles and make needle positioning difficult. Furthermore plastic needles do not have very sharp tips, which is for interventional procedures not the optimum.

Further problems directly related to biopsy are the resolution of the imaging system which is limited and, furthermore, these imaging modalities cannot in most cases discriminate normal and neoplastic tissue and further differentiate between benign and malignant tissue.

As a result of that, there is a high level of uncertainty whether an appropriate tissue specimen is taken.

In addition to that, the biopsies are often taken blindly, with limited feedback of where the needle is relative to the target tumor, which leads to an additional uncertainty whether the lesion has been hit by the needle. It is clear that guidance improvement is required to target the biopsy needle to the correct position in the tissue.

A further limitation is that even if one could guide the biopsy needle to the exact location corresponding to the pre-recorded image, one is never sure that this is the exact location due to the compressibility of the tissue. Due to the force of the biopsy needle on the tissue during advancement, the tissue may become deformed.

If the specimen taken appears to be cancerous, in most cases this cancerous tissue will be removed by surgery (especially when the tumor is well localized) or treated percutaneously using RF, microwave, or cryoablation.

The surgical approach is confounded by the fact that the surgeons typically use only their eyes and hands (palpation) to find the tumor and have to rely on the information of pre-recorded images. These pre-recorded images provide information on the position of the tumor but do not always clearly show the tumor boundaries. Sometimes, the surgeon implants a marker under image guidance, providing him or her with a reference point to focus on during the surgical procedure. Again guiding the localization wire to the correct position is difficult.

The biopsy device may also be used as a device for administering drugs or a therapy (like ablation) at a certain position in the body without removing tissue, for instance for injecting a fluid at the correct location of the affected body part. The same drawbacks apply for these interventions where it is difficult to guide the biopsy device to the correct location.

SUMMARY OF THE INVENTION

It is an object of the invention to mitigate one or more of the above mentioned drawbacks. Another object is to provide a device the position of which is precisely locatable in an MRI-image.

This is achieved by the subject matter of the respective independent claims. Further exemplary embodiments are described in the respective dependent claims.

Generally, a device for intervention in a high magnetic field comprises an elongate shaft with a tip portion, and a passive LC-circuit positioned at the tip portion, wherein the LC-circuit is formed as an inductor-capacitor resonator, wherein the needle may be produced in a silicon process.

It is noted that the device for intervention in a high magnetic field may be a needle of a syringe or for a biopsy, or may be a canula, a trocar or a catheter or another minimal invasive interventional instrument or surgical tool.

For example, a needle which is compatible with high magnetic fields comprises sharp needle tip to achieve a more painless treatment and comprises a tracking modality on the needle tip to enable a tracking of the needle in the MRI in order to improve the positioning of the needle to the target region.

The tracking modality according to the invention is the passive LC-circuit. It may be an advantage that the LC circuit is a passive circuit which does not require any wiring like active circuits.

By the magnetic field of an MRI, the passive LC-circuit will be activated to oscillate. Said oscillation will result in a response magnetic field which in turn may be sensed by the MRI unit so that the passive LC-circuit and therefore the tip portion of the device is visible and therefore traceable in the MRI-image. By way of this, the guiding (tracking) of the device is facilitated.

It may be understood, that an inductor which is usually formed as a coil comprises a main axis, wherein the windings of the coil extend substantially around said main axis.

According to an exemplary embodiment of the invention is the main axis of the inductor of the LC-circuit orientated parallel to the longitudinal axis of the shaft. However, the main axis of the inductor of the LC-circuit may also be orientated radial to the shaft, or in any other suitable angle to the shaft.

According to another exemplary embodiment, the device comprises a plurality of passive LC-circuits, wherein the main axis of the inductor of each of the LC-circuits may be orientated in different directions relative to shaft. This may further improve the visibility of the portion of the device at which the plurality of LC-circuits is placed, since the response magnet fields of the LC-circuits will be focused at the main axis of each of the inductors.

According to yet another embodiment, the capacitor of a LC-circuit is formed as a three dimensional trench capacitor.

According to another embodiment the capacitor of a LC circuit is formed as a planar metal-isolator-metal capacitor, where a dielectric with an extremely high dielectric constant such as a ferroelectric thin film material with perovskite structure such as lead titanate zirconate or barium titanate is applied as isolator material between the metal plates of the capacitor. I.e., the passive LC-circuit comprises a dielectric material with a high relative permittivity. In this way a very small capacitor size can be achieved, which is requested to mount the device on e.g. the tip of a needle According to another embodiment of the invention, the device further comprises a sensing element, wherein the sensing element may comprise at least two optical fibers, wherein one of the fibers is adapted to emit light and another one of the fibers is adapted to receive light reflected back into said fiber.

In case of integrated fibers, a suitable imaging modality for processing the optical information transmitted by the fibers, may be one of reflectance spectroscopy, fluorescence spectroscopy, autofluorescence spectroscopy, differential path length spectroscopy, Raman spectroscopy, optical coherence tomography, light scattering spectroscopy, or multi-photon fluorescence spectroscopy.

The reflectance spectra of different types of tissue are in general different due to the different molecular constitution of the tissues. As a result of measuring these spectra, it is possible distinguish different tissues from each other.

The optical information may be registered into the pre-recorded image taken by an non-invasive imaging modality (X-ray, CT, MRI, Ultrasound) by making use of the location identified by the position sensor, i.e. the tracking modality, in the frame of reference that in turn is registered to a position in the pre-recorded image.

According to another aspect of the invention, a method is provided for manufacturing a device as described above.

In general, the method of manufacturing or producing a device for intervention in a high magnetic field comprises the steps of forming a capacitor, forming an inductor, wherein the inductor is connected to the capacitor so that a passive LC-circuit is provided, fixing the LC-circuit at the tip portion of the shaft of the device, wherein the LC-circuit may be realized on top of a Si wafer.

According to an embodiment of the invention, the Si wafer is diced so that a separate tip portion of the device is formed, wherein the tip portion integrally includes the LC-circuit, wherein the LC-circuit together with the tip portion is fixed at the shaft of the device.

On the other hand, the Si wafer may be diced so that a single LC-circuit is isolated, wherein the isolated LC-circuit is subsequently fixed at the shaft of the device, and preferably at the tip portion of the shaft of the device, wherein the tip portion may be made out of silicon.

According to another embodiment, the LC circuits were processed on silicon, are transferred to a flexible substrate and subsequently fixed at the shaft or the tip of the shaft of the device.

According to another embodiment, the method further comprises the step of providing the device with a sensing element like optical fibers.

It has to be noted that embodiments of the invention are described with reference to different subject matters. In particular, some embodiments are described with reference to method type claims whereas other embodiments are described with reference to apparatus type claims. However, a person skilled in the art will gather from the above and the following description that, unless other notified, in addition to any combination of features belonging to one type of subject matter also any combination between features relating to different subject matters is considered to be disclosed with this application.

The aspects defined above and further aspects, features and advantages of the present invention can also be derived from the examples of embodiments to be described hereinafter and are explained with reference to examples of embodiments. The invention will be described in more detail hereinafter with reference to examples of embodiments but to which the invention is not limited.

BRIEF DESCRIPTION OF THE DRAWING

In the following, the invention will be described by way of exemplary embodiments with respect to the attached drawing.

The illustration in the drawings is schematically only and not to scale. It is noted in different figures, similar elements are provided with the same reference signs.

DETAILED EMBODIMENTS OF THE INVENTION

Figure 1:
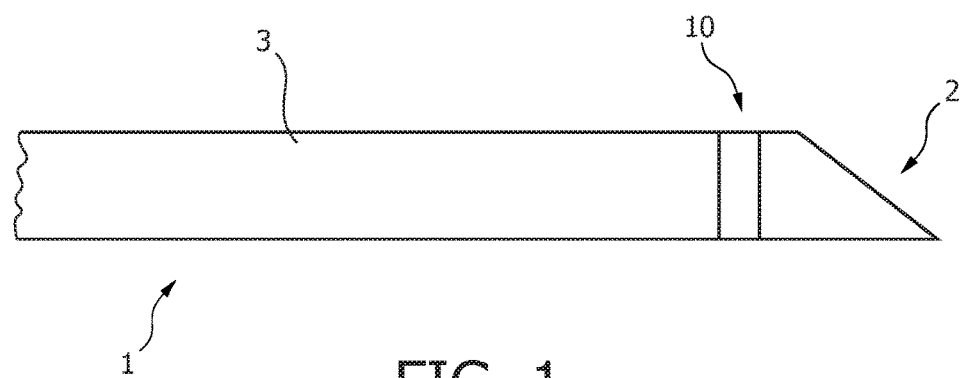
FIG. 1 is a schematic view of a needle according to a first embodiment of the invention.

In FIG. 1, a first embodiment of a needle according to the invention is shown. The needle 1 comprises a shaft 3, a tip portion 2 and is provided with a LC-circuit 10, which is located in the vicinity of the tip portion. The LC-circuit 10 is orientated so that the main axis of the inductor of the LC-circuit is parallel to the longitudinal axis of the shaft of the needle 1. In order to achieve MR compatible needles with sharp needle tip for painless needles, Si tips are realised by Si bulk dicing or Si micro-machining. These Si processed tips are mounted by e.g. gluing on e.g. a plastic part to achieve a high magnetic field MR compatible needle.

These Si needle tips can also be coated with a biocompatible coating of e.g. parylene.

Figure 2:
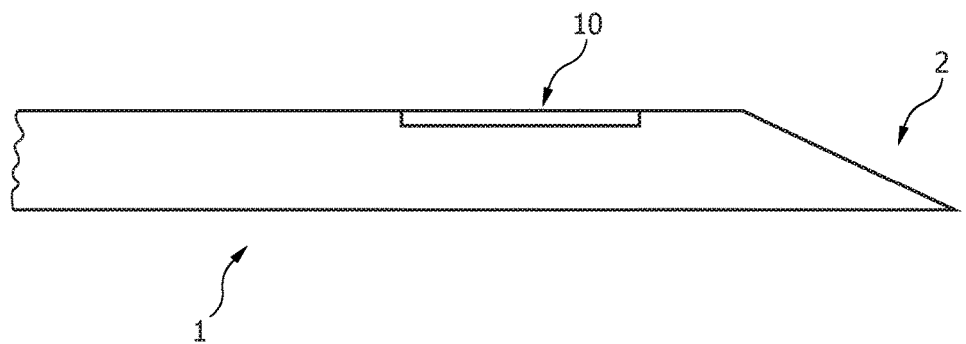
FIG. 2 is a schematic view of a needle according to a second embodiment of the invention.

FIG. 2 illustrates a second embodiment of a needle according to the invention, wherein the LC-circuit 10 is located at the side surface of the needle 1 adjacent to the tip portion 2 of the needle. This orientation also enables tracking of the needle.

As schematically shown in FIG. 2, a Si needle 1 with a tip portion 2 is processed, which may be finally glued on a plastic carried to realize a 3 T compatible needle. On the Si needle, an LC resonance circuit 10 may be integrated. This LC circuit 10 may be processed on top of a Si wafer with a typical thermal oxide of 500 nm.

For example, in a first step a capacitor is processed with a capacitance value in the order of 20-200 pF. This is realized using either a MIM capacitor, where the isolator has a high dielectric constant of e.g. 1000-1700. With these high dielectric thin film materials, very large capacitors of 20-100 $nF/mm^2$ may be produced in production on top of Si substrates with a thermal oxide layer of typically 500 nm. So the capacitor can be realized on small size of 0.2-0.05 $mm^2$, using standard semiconductor processes. Additionally a trench technology for the capacitors with 20-70 nF/mm$^2$ typical capacitance values running in semiconductor production sites can be used, which offer again very small capacitors of 0.01-0.2 mm$^2$. This is as described above for capacitors along both production sites available technology.

For the metal interconnects to the spiral inductor located next to the capacitor metals such as Al or Al(Cu) may be used. To realize spiral inductors with an inductance value on the order of 10-100 nH, with low series resistance to maximize Q-factors (quality factors), a thick Copper metallization deposited by galvanic and/or electroless deposition will be used. A Titanium Nitride, or similar material, for use as an adhesion and electromigration prevention/minimization layer will be deposited by, for example sputtering, prior to Copper growth. The thick Copper metallization will be coated with a Gold or Nickel-Gold layer deposited by sputtering and/or electroless plating to prevent oxidation. With a Cu/Au metal layer of typically 10-20 μm thickness and an inductor size of 1 mm×3 mm with 3-7 metal turns an inductor of 10-80 nH with a quality factor of 20-30 is obtained. With this LC integrated resonance circuits are realized on top of a Si wafer.

In the next step these wafers are diced. One device is diced that it enables the form of a needle so that a sharp Si needle is obtained, which can be put into the tissue with low pain. Alternatively these shaped edges can also be realized with a bulk micro-machining step before the needles are diced out of the wafer. It is noted that the slope of the needle will be upwardly directed (in contrast to the downwardly directed slope in FIG. 2), in case the wafer is wet etched from the back side.

To ensure that the needle is always locatable within an MRI image a second such coil-capacitor combination needs to be mounted orthogonally to the first LC circuit (that forms the needle tip). The second LC resonator is fabricated on Si using the approach described previously. The supporting Si substrate of the second LC resonator is mechanically and/or chemically thinned down and attached to the side (orthogonal to the resonator+needle) of a 3 T compatible plastic rod the end of which supports the Si needle tip.

Alternatively, a series of LC circuits are realized around a needle tip. This can be a Si needle tip to achieve very sharp edges, but it can also be a plastic needle tip or a ceramic needle tip. Here the LC circuits are realized on top of a Si substrate with a thermal oxide layer of several hundred nm.

After processing of the circuits, a coating of e.g. polyimide or parylene may be applied on the LC circuits and the substrate may be transferred to a glass substrate. The Si is back-grinded and finally fully etched away by wet or dry etching, stopping on the SiO2 layer.

The circuits are then removed from the glass substrate, so that a flexible LC circuits on polymide or parylene foil remain. After separation of the LC circuits the foils are glued on the needle tips such as plastic needles or ceramic needles.

Figure 3:
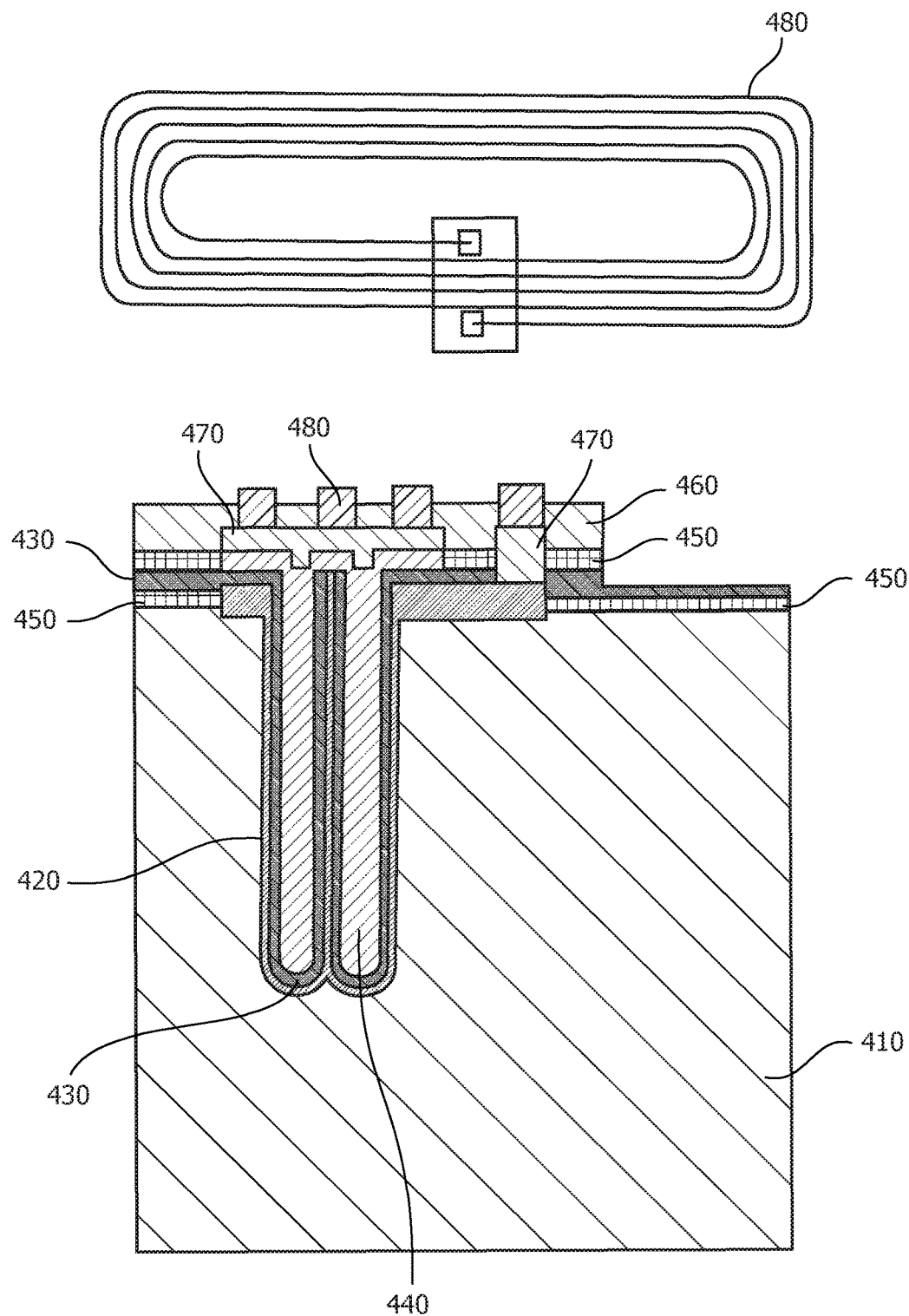
FIG. 3 is a schematic visualization of an exemplary LC-circuit according to the invention.

FIG. 3 shows a possible inductor-capacitor resonator integrated into a piece of Silicon 410. In the upper part, FIG. 3 shows a top view on the windings of the inductor. In the lower part, FIG. 3 shows a section view of the elements of a capacitor located 'under' the inductor.

The inductor windings are formed in Metal 480 which if solely made of AlSiCu should be several microns thick for low losses or alternatively could be a thin layer with a CuNiAu or NiAu plating on top. The ends of the inductor windings are connected to the inner conductor 440 (Phosphorous doped Polysilicon) and outer conductor 420 (Phosphorous doped Silicon) of a three dimensional 'trench' capacitor by which the insulating Silicon Oxide 450, 460 and Silicon Nitride or Silicon Oxide/Silicon Nitride/Silicon Oxide (ONO) layers 430 filled with Metal 470 (AlSiCu). To achieve higher capacitance densities a multitude of doped Polysilicon conductors with Silicon Oxide/Silicon Nitride insulators could be stacked inside the trenches etched into thickness of the Silicon wafer. Multiple thin layers and alternative, higher dielectric constant for example Hafnium Oxide, materials could be used for the dielectric layers. Growth of such thin layers could be achieved using atomic layer deposition techniques in place of (plasma enhanced) chemical vapour deposition.

To maximize the Quality factor of the inductor it would be preferred to use a high-resistivity Silicon substrate to minimize the loss in the Silicon. To further reduce these losses the remaining area of Silicon wafer not needed to form the three dimensional 'trench' capacitor does not receive the Phosphorous doping and instead receives an Argon implant to create a layer of surface damage at the interface between the Silicon wafer and the first (thin) Silicon Oxide layer 450. This serves to create traps for charge (electrons assuming p-type Silicon) that would otherwise be attracted to fixed positive charges found inside the Silicon Dioxide layer.

As an alternative to the Argon implant a thin layer of amorphous Silicon would also suffice. The doped Polysilicon could also be used to realize resistors should other passive components need to be integrated onto a Silicon tip for example for power dissipation to heat the tip.

Alternatively to the trench capacitor also a planar metal-isolator-metal capacitor with a high dielectric constant can be applied to integrate the large capacitance values on a small area, which are needed. To achieve large capacitance on small size materials with dielectric constants of several hundred up to several thousands, crystallizing in a perovskite lattic is applied.

In another embodiment is the LC circuit processed on top of Si with a silicon oxide layer and is directly processed on the needle tip portion.

In a further exemplary embodiment these LC circuits can be realised also with a tunable capacitor. A special feature of the metal-isolator-metal capacitors made with ferroelectric materials such as barium titanate or barium strontium titanate or lead titanate zirconate is that they show high dielectric constants and thus large capacitance densities but that the dielectric constant and thus the capacitance is changing the value with the applied dc field. Applying a dc voltage to the capacitance the capacitance can thus be tuned. In this way also the resonance frequency of the LC circuit can be tuned.

So with LC circuits realised on top of the Si making use of metal isolator metal capacitors based on ferroelectric thin film materials the intense local signal enhancement achieved during MR imaging on the device such as the needle can be controlled. Applying a dc voltage along metal or poly silicon resistor interconnects to the capacitor shift the resonance frequency of the tuned LC circuit and result in no signal enhancement in the MR image. This can excellently be used to track in the MR the device due to a local signal enhancement. Achieving the target with the device making use of the tracking in the MR, the enhanced signal of the device, comprising the LC circuit, can be reduced for a further investigation by shifting the resonance frequency of the LC circuit by tuning the capacitor.

Alternatively, a pair of back-to-back connected PIN diodes can be fabricated in the Silicon substrate in the silicon substrate with the integrated capacitor and inductor. As described by Sun et al (Sun C K, Nguyen R, Albares D J, Chang C T(1997), "Photo-injection back-to-back PIN switch for RF control". Electronics Letters, 28 Aug. 1997, Vol 33 No 18, 1579-1580) and Jacobs et al (Jacobs E W, Fogliatti D W, Nguyen H, Albares D J, Chang C T, Sun C K(2002), "Photo-Injection p-i-n Diode Switch for High-Power RF Switching", IEEE Transactions on Microwave Theory and Techniques, Vol 50 (2), 413-419) these can be used to form high quality (high RF isolation and low 'ON' resistance hence limited negative impact on the Quality factor of the resonant circuit), light operated (photo-injection) switches without the need for an electrical DC bias current.

By attaching an optical fibre to the needle tip bearing the PIN diode switch and LC resonator light of appropriate wavelength and intensity can be guided directly to the photoactive region of the PIN diode switch enabling it be actuated without the need for wires or a direct electrical connection. The PIN diode switch could be used to change the resonance frequency of the LC circuit being used for signal enhancement in the MRI image by connecting/disconnecting an additional capacitor to the inductor to shift the resonant frequency towards/away from the operating frequency of the MRI machine.

Alternatively the PIN diode switch could be used to connect/disconnect the MIM or 3D trench capacitor to the inductor to form the resonant circuit for signal enhancement in the MR image. In the 'off' (no illumination) state the PIN diode would provide only a very small capacitance hence the LC resonance frequency would be higher than required for MR signal enhancement. When illuminated the PIN diode would act as a small resistance in series with the 3D trench or MIM capacitor giving a small drop in LC Quality factor and hence signal enhancement effect however signal enhancement hence needle tracking would be possible.

Use of the PIN diode switch would enable the signal enhancement to be turned on or off as desired during the procedure—on to locate the needle and off so that the surrounding tissue could be precisely imaged. As an alternative to the use of PIN diodes a photo-actuated MOS (metal-oxide-semiconductor) capacitor could be fabricated on the Silicon wafer and used in place of a 3D trench or a planar MIM capacitor to form the LC resonant circuit. By illuminating the surface of the MOS capacitor with light (guided down a fibre to the needle) of appropriate wavelength and intensity the capacitance value and hence resonance frequency of the LC circuit can be modified.

Figure 4:
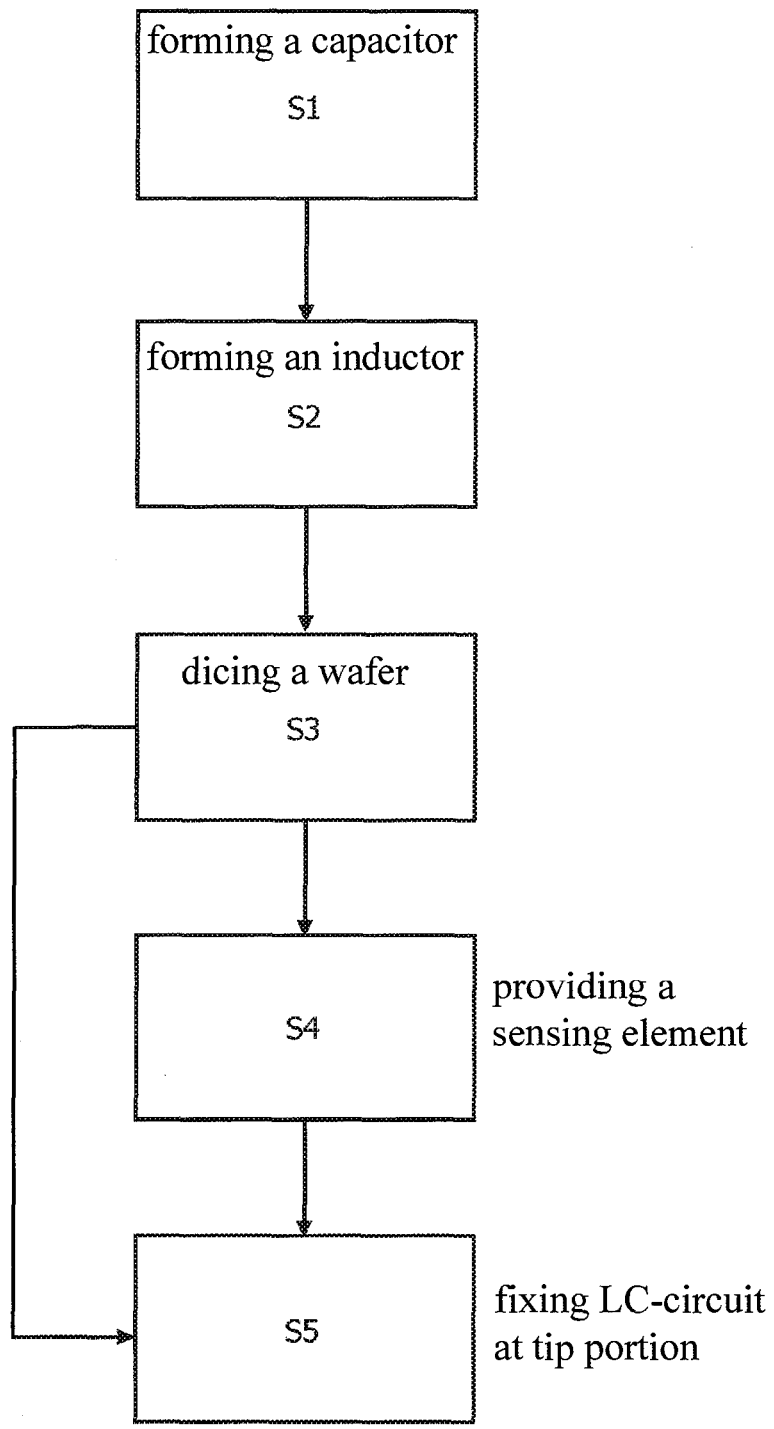
FIG. 4 is a flow chart illustrating the step of manufacturing a needle according to the invention.

FIG. 4 is a flow chart, showing steps of a method for producing a needle according to the invention. It will be understood, that the steps described with respect to the method, are major steps, wherein these major steps might be differentiated or divided into several sub steps. Furthermore, there might be also sub steps between these major steps. Therefore, a sub step is only mentioned, if said step is important for the understanding of the principles of the method according to the invention. Aspects of the method are already described above with respect to the structure of the LC-circuit as shown in FIG. 3.

A method of producing a device for intervention in a high magnetic field according to the invention comprises in general the following steps.

In step S1 a capacitor like a trench capacitor or planar metal-isolator-metal capacitor is formed.

In step S2 an inductor is formed, wherein the inductor, i.e. the ends of the windings of the coil of the inductor are connected to the capacitor so that a passive LC-circuit is provided.

Preferably, step S1 and step S2 are performed so that the LC-circuit is realized on top of a Si wafer which may comprise a silicon oxide layer. Alternatively, a separate tip portion with an integrally realized LC-circuit is produced on top of a Si wafer.

In step S3, the Si wafer is diced.

In step S4 which is an optional step which may be omitted, the device is provided with a sensing element like an optical fiber.

Finally in step S5, the LC-circuit is fixed at the tip portion of the shaft of the device. In case that the LC-circuit is formed integrally with a tip portion of the device, the tip portion with the LC-circuit will be fixed at the shaft of the device.

Figure 5:
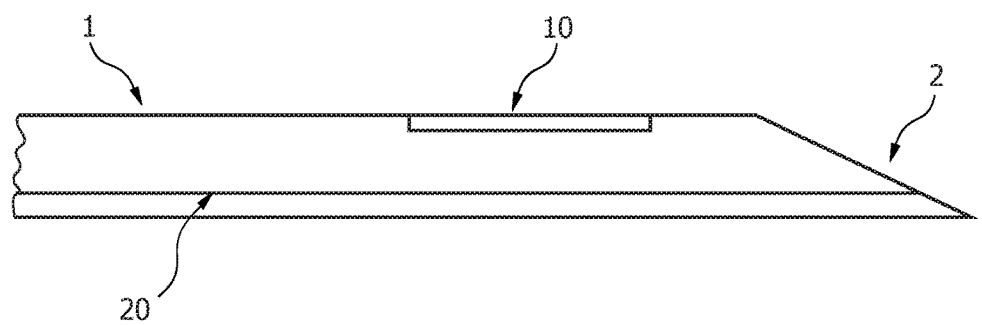
FIG. 5 is a schematic view of a needle according to a third embodiment of the invention.

An exemplary embodiment realized by step S1 to S5 (including step S4) according to the described method is depict in FIG. 5. A needle 1 according to a third embodiment of the invention comprises a MRI compatible sensing element 20 that enables measuring tissue parameters in front of the needle. For instance integrating optical fibers into the needle would allow tissue discrimination. Fibers are MRI compatible. At least one fiber is coupled to light sources to illuminate the tissue in front of the needle, while at least one fiber is coupled to a spectrometer that measures the spectral distribution of the reflected light back into the fiber. The measured shape of the spectrum is a signature of the tissue in front of the needle and can be used to detect for instance abnormal tissue. This would be valuable in case of cancer detection.

Preferably, the fibers are located in the shaft such that the respective ends of the fibers are located in the tip portion of the device. In other words, some of the fibers might end in the front surface of the device, and/or some of the fibers might end in the vicinity of the front surface at the side surface or wall surface of the device. Furthermore, there could be some fiber ends orientated in the direction to a biopt harvested by the biopsy device, and some other fiber ends orientated in the direction to the front or the side of the device, for optical fine guidance prior to biopsy.

A system including a needle with fibers will further comprise the following set up. At least one of the fibers is coupled to a light source and is used for excitation of the tissue in front of the shaft tip of the device. Part of the scattered and emitted light is collected by another fiber and guided to a detector including a spectrograph and a CCD-camera, where for instance an autofluorescence or Raman spectrum is recorded. Upon inspection of the spectrum it may be decided to either take a biopsy or to move the shaft further to another position if no anomalies in the spectrum are found.

By integrating fibers into the device, optical probing at the tip of the distal end of the fiber at the tip of the biopsy device becomes possible. The analysis can then be done at a console that is attached to the proximal end of the fiber.

It is worth noting that this embodiment allows two-dimensional imaging of scattering and absorption properties of the tissue surrounding the needle, with a lateral resolution equal to that of the fiber-to-fiber distance. Moreover, it is also possible to perform an optical coherence scan for each fiber, which gives for each fiber a depth scan along a line. Combining these lines, it is possible to reconstruct a three-dimensional image of the tissue around the needle, again with a lateral resolution equal to that of the fiber-to-fiber distance.

One other variation of this embodiment is the implementation of fluorescence imaging and/or spectroscopic measurements. In this case source and fiber serve as an excitation fiber, hence to excite the fluorescent molecules and collection fiber to collect the fluorescent light emitted by the molecules.

Finally, it is also possible to perform diffuse optical tomography (DOT) around the needle. This allows functional imaging in a relatively large volume around the needle similar to what is done in optical mammography. In this embodiment one or more fibers are used for (sequential) illumination of the tissue. One or more other fibers are used to collect the scattered light. Using an image reconstruction algorithm it is possible to obtain a 3D map of the optical properties in a region around the needle. The main advantage of DOT is the high penetration depth compared to other optical methods: about half of the source detector distance. The most advantageous wavelength region for DOT is the near infrared (NIR). Here the penetration depth is at its maximum and the optical properties are strongly determined by important physiologic parameters like blood content and oxygen saturation. By combining DOT at different wavelengths it is possible to translate optical parameters into physiological parameters.

Figure 6:
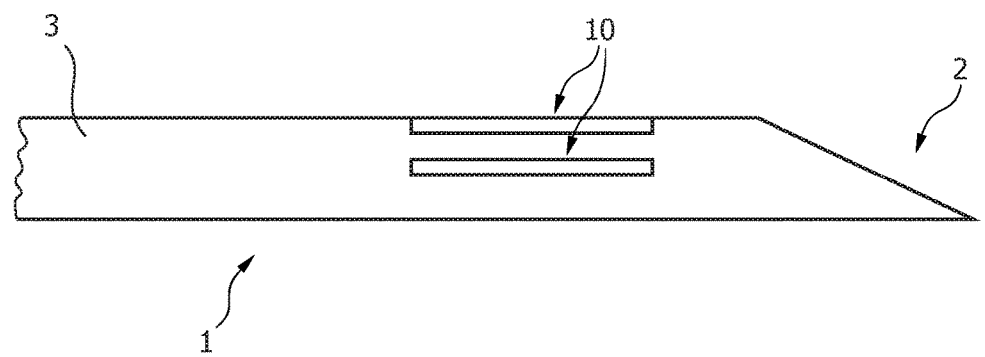
FIG. 6 is a schematic view of a needle according to a fourth embodiment of the invention.

FIG. 6 illustrates a fourth embodiment of a needle according to the invention, wherein a plurality of LC-circuits 10 is located at the side surface of the shaft 3 of the needle 1 adjacent to the tip portion 2 of the needle, wherein the inductors of the LC-circuits are orientated in different directions, which enable a better tracking of the needle, since at least one of the LC-circuits is orientated such that the MRI system will recognize its resonance magnetic field.

The imaging methods mentioned above can rely on direct absorption and scattering properties of the tissue under investigation, however it is also possible to map fluorescence of tissue, by illuminating with the proper wavelength and simultaneously blocking the illumination wavelength at the detector side. The fluorescence can be endogenous or exogenous, i.e. with the aid of contrast agents. The specificity of the fluorescence detection can be improved by methods well known in the art such as fluorescence lifetime imaging.

While the invention has been illustrated and described in detail in the drawings and foregoing description, such illustration and description are to be considered illustrative or exemplary and. not restrictive; the invention is not limited to the disclosed embodiments.

Other variations to the disclosed embodiments can be understood and effected by those skilled in the art in practicing the claimed invention, from a study of the drawings, the disclosure, and the appended claims. In the claims, the word "comprising" does not exclude other elements or steps, and the indefinite article "a" or "an" does not exclude a plurality. The mere fact that certain measures are recited in mutually different dependent claims does not indicate that a combination of these measured cannot be used to advantage. Any reference signs in the claims should not be construed as limiting the scope.

LIST OF REFERENCE SIGNS 1 device, needle
2 tip portion
3 shaft
10 LC-circuit
20 sensing element (e.g. optical fiber)
410 Silicon
420 Phosphorous doped Silicon (a pole of the capacitor)
430 Silicon Nitride/Silicon Oxide/Silicon Nitride stack (isolation between poles of capacitor)
440 Phosphorous doped Polysilicon (other pole of capacitor)
450, 460 Silicon Dioxide
470 metal 1 (AlSiCu)
480 metal 2 (AlSiCu) (inductor)

The invention claimed is:

1. A medical interventional device for intervention in a high magnetic field, the device comprising:
   an elongate shaft with a tip portion; and
   a plurality of passive inductor-capacitor (LC)-circuits positioned at the tip portion, wherein each of the plurality of passive LC-circuits comprises a resonator including an inductor and a capacitor integrated into an Si wafer, wherein the inductor is located on a portion of a surface of the Si wafer and the capacitor is located under the inductor below the portion of the surface of the Si wafer,
   wherein each capacitor of the plurality of passive LC-circuits comprises a trench capacitor having a trench formed in the Si wafer and includes inner and outer conductors and a first dielectric between the inner and outer conductors, the outer conductor contacting the Si wafer and a first metal contact, and the inner conductor being located over the first dielectric and contacting a second metal contact,
   wherein the first metal contact fills an exposed portion of the outer conductor not covered by the first dielectric and by a second dielectric formed over the first dielectric to contact the outer conductor, and the first metal contact is spaced away from the trench,
   wherein the second metal contact fills an exposed portion of inner conductors of at least two trench capacitors not covered by the second dielectric formed over the first dielectric, the second metal contact is formed directly over trenches of the at least two trench capacitors and is isolated from the first metal contact, and
   wherein the second metal contact contacts at least two inductor windings of the inductor.

2. The device as claimed in claim 1, wherein each inductor of the plurality of passive LC-circuits includes an elongated spiral coil having a first dimension which is longer than a second dimension, each inductor having a main axis along the first dimension, and wherein one of the main axes of one of the elongated spiral coils is orientated parallel to a longitudinal axis of the elongate shaft.

3. The device as claimed in claim 1, wherein each inductor of the plurality of passive LC-circuits includes an elongated spiral coil having a first dimension which is longer than a second dimension, each inductor having a main axis along the first dimension, and wherein one of the main axes of one of the elongated spiral coils is orientated radial to the elongate shaft.

4. The device as claimed in claim 1, further comprising a sensing element.

5. The device as claimed in claim 4, wherein the sensing element comprises at least two optical fibers, wherein one of the fibers is adapted to emit light and another one of the fibers is adapted to receive light reflected back into said fiber.

6. The device of claim 1, wherein the tip portion including the plurality of passive LC-circuits is formed separately from the elongate shaft and affixed to the elongate shaft.

7. The device of claim 1, wherein areas of the Si wafer including the capacitor have phosphorous doping and remaining areas of the Si wafer including not needed to form the capacitor includes an Argon implant.

8. A method of manufacturing a device for intervention in a high magnetic field, the method comprising the acts of:

forming a plurality of capacitors including trench capacitors having trenches formed in an Si wafer, inner and outer conductors and a first dielectric between the inner and outer conductors, the outer conductor contacting the Si wafer and a first metal contact, and the inner conductor contacting a second metal contact;

forming a second dielectric over the first dielectric;

removing a first part of the first dielectric and the second dielectric to expose a portion of the outer conductor not covered by the first dielectric and the second dielectric;

removing a second part of the second dielectric to expose a portion of inner conductors of at least two trench capacitors not covered by the second dielectric;

forming a plurality of inductors on a portion of a surface of the Si wafer, wherein the trench capacitors are located under the inductors below the portion of the surface of the Si wafer;

connecting the plurality of inductors to the plurality of capacitors so that a plurality of passive inductor-capacitor (LC)-circuits is formed, each of the plurality of passive LC-circuits including one of the plurality of capacitors and one of the plurality of inductors; and fixing the plurality of passive LC-circuits at a tip portion of a shaft of the device, wherein the act of forming the plurality of capacitors includes acts of filling the first metal contact in the exposed portion of the outer conductor spaced away from the trenches to contact the outer conductor; and filling the second metal contact in the exposed portion of the inner conductors of the at least two trench capacitors directly over trenches of the at least two trench capacitors to contact the inner conductors, the second metal contact being isolated from the first metal contact, wherein the second metal contact contacts at least two inductor windings of the inductor.

9. The method as claimed in claim 8, further comprising the act of dicing the Si wafer.

10. The method as claimed in claim 9, wherein the dicing act forms the tip portion of the device separate from the shaft, wherein the tip portion integrally includes the plurality of passive LC-circuits, and wherein the fixing act fixes the plurality of passive LC-circuits together with the tip portion to the shaft of the device.

11. The method as claimed in claim 9, wherein the dicing act isolates the plurality of passive LC-circuits, and wherein the isolated plurality of passive LC-circuits is fixed at the shaft of the device.

12. The method as claimed in claim 8, further comprising the act of coupling a sensing element to the shaft.

13. The method of claim 8, wherein the act of forming a plurality of capacitors includes doping with phosphorous areas of the Si wafer including the plurality of capacitors and implanting with Argon remaining areas of the Si wafer not needed to form the plurality of capacitors.

* * * * *